(12) United States Patent
Xu et al.

(10) Patent No.: US 6,821,552 B2
(45) Date of Patent: Nov. 23, 2004

(54) METHOD AND APPARATUS FOR DETERMINING THE PASS THROUGH FLUX OF MAGNETIC MATERIALS

(75) Inventors: Yun Xu, Pittsburgh, PA (US); Wei Guo, Zelienople, PA (US); Stephen Turner, Moon Township, PA (US)

(73) Assignee: Honeywell International Inc., Morristown, NJ (US)

( * ) Notice: Subject to any disclaimer, the term of this patent is extended or adjusted under 35 U.S.C. 154(b) by 90 days.

(21) Appl. No.: 10/198,296

(22) Filed: Jul. 17, 2002

(65) Prior Publication Data

US 2003/0006132 A1 Jan. 9, 2003

Related U.S. Application Data

(63) Continuation of application No. 09/631,856, filed on Aug. 3, 2000, now Pat. No. 6,454,911.
(60) Provisional application No. 60/208,864, filed on Jun. 1, 2000.

(51) Int. Cl.[7] .......................... C23C 14/34; B05C 11/00; G01R 33/00; G01N 3/00
(52) U.S. Cl. ...................... 427/8; 118/712; 204/298.13; 204/298.17; 204/298.03; 73/806; 324/200; 324/260; 324/251; 324/259; 324/246
(58) Field of Search ...................... 204/192.12, 298.13, 204/298.17, 298.03, 192.13; 118/712; 427/8; 73/806; 324/200, 260, 251, 259, 246

(56) References Cited

U.S. PATENT DOCUMENTS

| | | | |
|---|---|---|---|
| 4,481,470 A | 11/1984 | Wallace | 324/228 |
| 5,282,947 A | 2/1994 | Brugge et al. | 204/298.2 |
| 5,658,442 A | 8/1997 | Van Gogh | 204/298.12 |
| 6,071,389 A | 6/2000 | Zhang | 204/298.12 |
| 6,086,725 A | 7/2000 | Abburi et al. | 204/192.1 |
| 6,258,217 B1 | 7/2001 | Richards et al. | 204/192.12 |
| 6,278,271 B1 * | 8/2001 | Schott | 324/251 |
| 6,299,740 B1 * | 10/2001 | Hieronymi et al. | 204/192.12 |
| 6,454,911 B1 * | 9/2002 | Xu et al. | 204/192.13 |

FOREIGN PATENT DOCUMENTS

| | | | |
|---|---|---|---|
| GB | 2324612 | 1/1998 | G01R/33/10 |
| GB | 2353294 A | 7/2000 | C23C/14/35 |
| WO | WO 9848269 | 10/1997 | G01N/27/82 |
| WO | 99/10548 | 3/1999 | C22C/19/07 |

OTHER PUBLICATIONS

Patent Abstracts of Japan, Publication No. JP 59108970, Jun. 1984.
Patent Abstracts of Japan, Publication No. JP 08253859, Jan. 1996.
PCT International Search Report, Application No. PCT/US01/16410, Nov. 27, 2001.

* cited by examiner

*Primary Examiner*—Steven VerSteeg
(74) *Attorney, Agent, or Firm*—Wells St. John P.S.

(57) ABSTRACT

The invention includes an apparatus and method for determining the pass through flux of magnetic materials. The apparatus comprises one or more magnetic field sensors arranged in such a way as to collect field strength data in any or all the x, y, z directions. The apparatus also comprises a magnet field source or arrangement of magnet field sources which are placed beneath the material being characterized and includes a mechanism whereby the magnetic material can be mapped by the movement of any one or combination of: magnetic field source or sources, sensors and magnetic material. The invented method comprises the use of various configurations of magnetic sources in order to generate a magnetic field that emulates the open-loop condition found in magnetron sputtering.

17 Claims, 5 Drawing Sheets

(1 of 5 Drawing Sheet(s) Filed in Color)

MAGNETIC FIELD STRENGTH (GS)

METHOD AND APPARATUS FOR DETERMINING THE PASS THROUGH FLUX OF MAGNETIC MATERIALS

RELATED PATENT DATA

This patent resulted from a continuation application of U.S. patent application Ser. No. 09/631,856, filed on Aug. 3, 2000, now U.S. Pat. No. 6,454,911, which resulted from a U.S. Provisional Application Ser. No. 60/208,864, filed on Jun. 1, 2000.

FIELD OF INVENTION

The invention described herein relates to a method and apparatus for the measurement and characterization of pass through flux (PTF) of magnetic materials. The invented process comprises the use of various configurations of magnets in order to generate a magnetic field that emulates the open-loop situation found in magnetron sputtering (with "open-loop" referring to a situation in which magnetic lines of force are generated by a source or sources, and passed through at least two materials of which one is gas (e.g., air) or vacuum). The invented process is also capable of determining the PTF uniformity, which corresponds to the uniformity of the magnetic field distribution and the magnetic properties of the material.

BACKGROUND OF THE INVENTION

Magnetron sputtering is widely used in the semiconductor and microelectronic industries to produce thin films. Magnetron sources increase the percentage of electrons that cause ionizing collisions by utilizing magnetic fields to help confine the electrons near the target surface. As a result magnetron sputtering processes can utilize current densities at the target of 10–100 mA/cm$^2$, compared to about only 1 mA/cm$^2$ for DC-diode configurations (see S. Wolf and R. N. Tauber, "Silicon Processing for the VLSI Era", volume 1, pp. 456). However, when magnetic sputtering targets such as cobalt, nickel or iron and their alloys are used in the magnetron sputtering machines, they tend to shield the sputtering cathode's magnetic field. Magnetic sputtering targets can thus reduce PTF (with PTF being a parameter that measures the percentage of magnetic field transmitted through a magnetic material). Because of this, the efficiency of the sputtering process is reduced. In addition, low PTF can cause other problems such as less uniform thin films and shorter target life. For purposes of interpreting this disclosure and the claims that follow, the terms "magnet" and "magnetic" are defined as follows. The term "magnet" indicates an object that is itself a so-called "permanent magnet" or an electromagnet. A "permanent magnet" being defined in accordance with the art to be a magnet that retains a remnant magnetic field in the absence of an external magnetizing field. The term "magnetic" refers to an object that is either itself a magnet, or that is magnetized when it is in magnetic contact with a magnet or an electric field. Thus, the term "magnetic target material" encompasses target materials that are magnetized by interaction with a magnet, such as, for example, target materials comprising one or more ferromagnetic substances.

FIGS. 1–4 illustrate a problem which can occur with low PTF. Specifically, FIG. 1 illustrates an ideal situation which can occur if PTF is optimized, and shows a target 100 exposed to uniform lines of magnetic flux from a source 110. FIG. 2 shows an enlarged view of a portion of target 100 after exposure to the PTF of FIG. 1, and shows a wide cavity 112 corresponding to an erosion profile of the target 100. FIG. 3 illustrates an non-ideal situation which can occur if PTF is low and non-optimized, and shows a target 200 exposed to non-uniform lines of magnetic flux from source 110. FIG. 4 shows an enlarged view of a portion of target 200 after exposure to the PTF of FIG. 3, and shows a narrow cavity 212 corresponding to an erosion profile of the target 200.

As the use of magnetic materials becomes more prevalent in the semiconductor and microelectronics industry, the demand for characterization and understanding of the uniformity and magnetic properties of the materials in open-loop situations is becoming increasingly important. However, there is no universally recognized method to accurately characterize the magnetic properties, such as PTF, in a fashion that produces consistent and reproducible measurement data for users of the materials.

Although not widely used, one method for determining PTF is the ASTM standard F1761-96. In the ASTM method, a horseshoe-shaped magnet is used as the magnetic source and a single Hall sensor is used to measure the magnetic field strength. The ASTM standard suggests measuring 5 points by rotating the target in a 30±5 degree interval, and then calculating the average value of the 5 points. Because this method only measures 5 points covering 120 degrees of the material, the uniformity information of a magnetic material cannot be determined adequately. Additionally, the ASTM method only measures one magnetic flux vector parallel to the material surface. Therefore, the flux and PTF information of the material is oversimplified and very limited. Furthermore, the reproducibility and repeatability (Gage R&R) of the ASTM measurements are poor.

Another method for determining PTF of a material utilizes a single ring magnet at one side of the material and a detector at another side of the material to measure magnetic field strength along a z-axis of the magnetic field. The detector can be moved relative to the target. The only measurements made by the detector are along the z-axis.

It is desirable to develop an apparatus and measurement method that not only provides reliable and consistent information about PTF and uniformity, but which is also capable of characterizing PTF in various configurations.

SUMMARY OF THE INVENTION

An apparatus of the present invention can be used for determining the pass through flux of magnetic materials, and comprises one or more magnetic field sensors arranged to collect field strength data of a magnetic field passing through a magnetic material. An exemplary apparatus comprises three Hall sensors arranged in such a way as to collect field strength data of all of the x, y, z axis directions of a field passing through a magnetic material. The apparatus also comprises a magnet, or arrangement of magnets, placed beneath the material being characterized, and includes a mechanism whereby the magnetic material can be mapped by the movement of any one or combination of: the magnetic field source or sources, the Hall probes and the magnetic material.

A method of the present invention comprises the use of various configurations of magnets in order to generate a magnetic field that emulates the open-loop condition found in magnetron sputtering. In one embodiment of this invention, the magnet configuration comprises the use of a solid round magnet within a ring-shaped magnet. The magnets are arranged in such a way that the flux flows from the ring to the solid magnet or vice versa. In another embodiment, a single ring-shaped magnet is used. In yet another embodiment, a small ring-shaped magnet is placed within a larger ring-shaped magnet.

The invention can comprise measuring magnetic field strengths a certain distance above a magnetic material in the x, y and z directions. The field strength measured in each of these three directions can be used individually, or combined together, to create a flux or PTF map. Such map can provide reliable and reproducible information regarding the magnetic properties and uniformity of the magnetic material. The map can be further interpreted based on statistical analysis to provide a method of PTF certification.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

This invention comprises an apparatus and method for determining and characterizing the PTF of magnetic materials.

As will become apparent from the discussion of FIGS. 5–9, the invention comprise utilization of magnets to pass a magnetic flux through a magnetic material, and further comprises measurement of the flux after it has passed through the magnetic material. Various configurations of magnets can be utilized in accordance with the present invention to generate a magnetic source field for measuring PTF. Although any shape magnet or magnets can work, it is preferable to use one of the following configurations: a) single solid magnet, b) a single ring-shaped magnet, c) a solid magnet within a ring-shaped magnet and d) a ring-shaped magnet within a larger ring-shaped magnet. In embodiments utilizing two or more magnets, each of the magnets is considered a separate magnetic field source. The magnets can be permanent magnets or electromagnets. If electromagnets are utilized, a magnetic field strength can be controlled by controlling electrical flow through the magnets.

Figure 1:
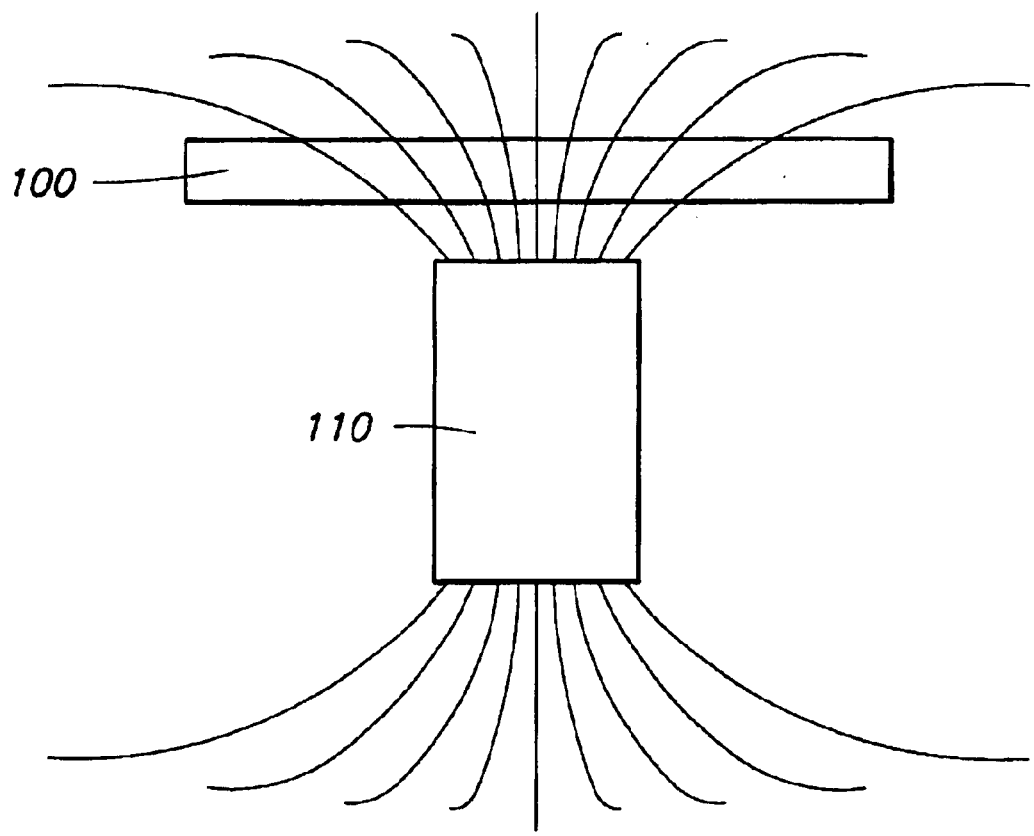
FIG. 1 is a schematic illustration of prior art idealized PTF effects on a sputtering target.
Figure 2:
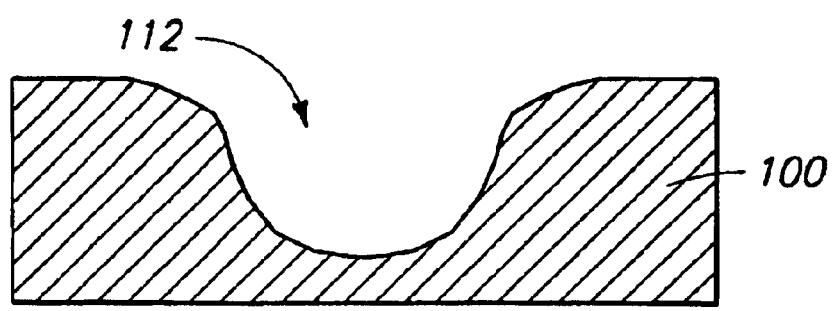
FIG. 2 is an enlarged cross-sectional view of a portion of the FIG. 1 target shown after the prior art processing of FIG. 1.
Figure 3:
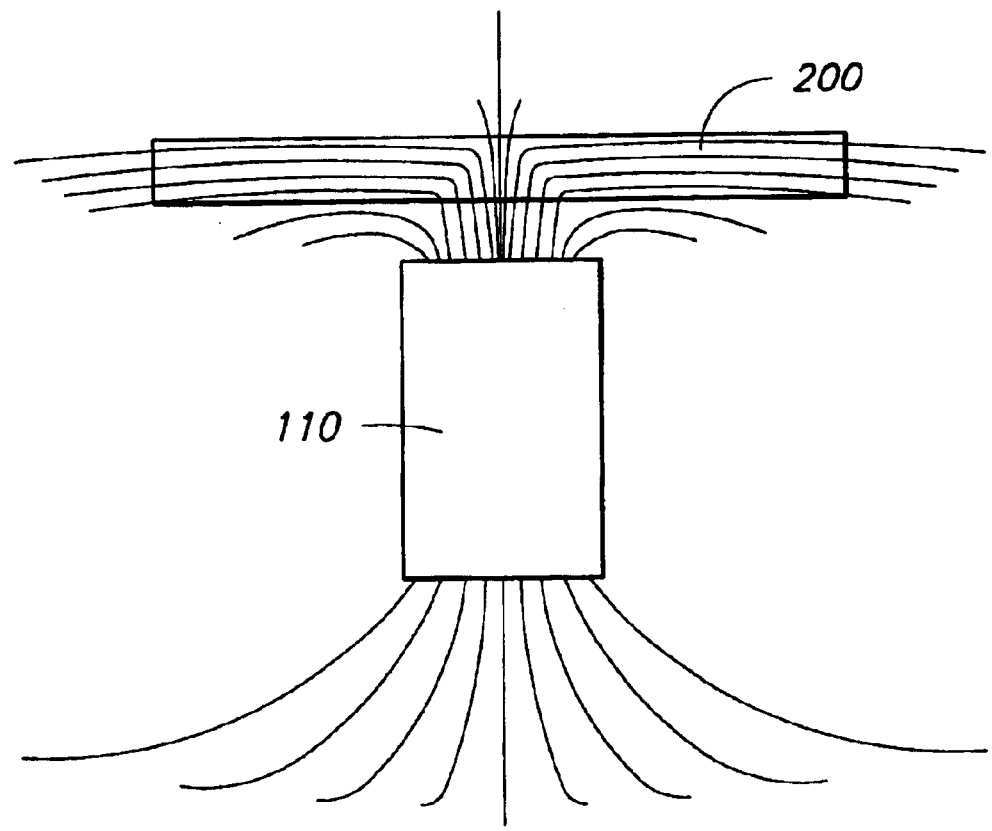
FIG. 3 is a schematic illustration of prior art non-idealized PTF effects on a sputtering target.
Figure 4:
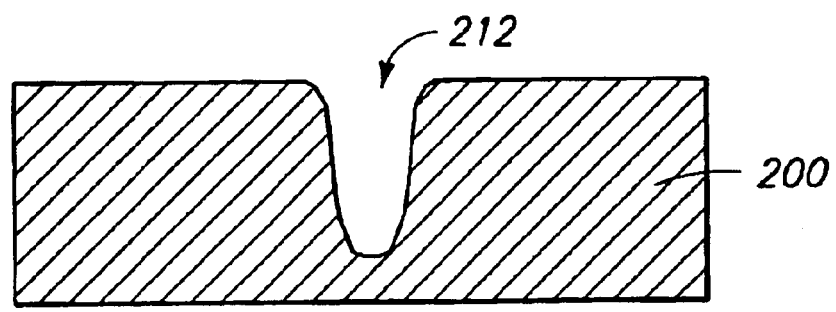
FIG. 4 is an enlarged cross-sectional view of a portion of the FIG. 3 target shown after the prior art processing of FIG. 3.
Figure 5:
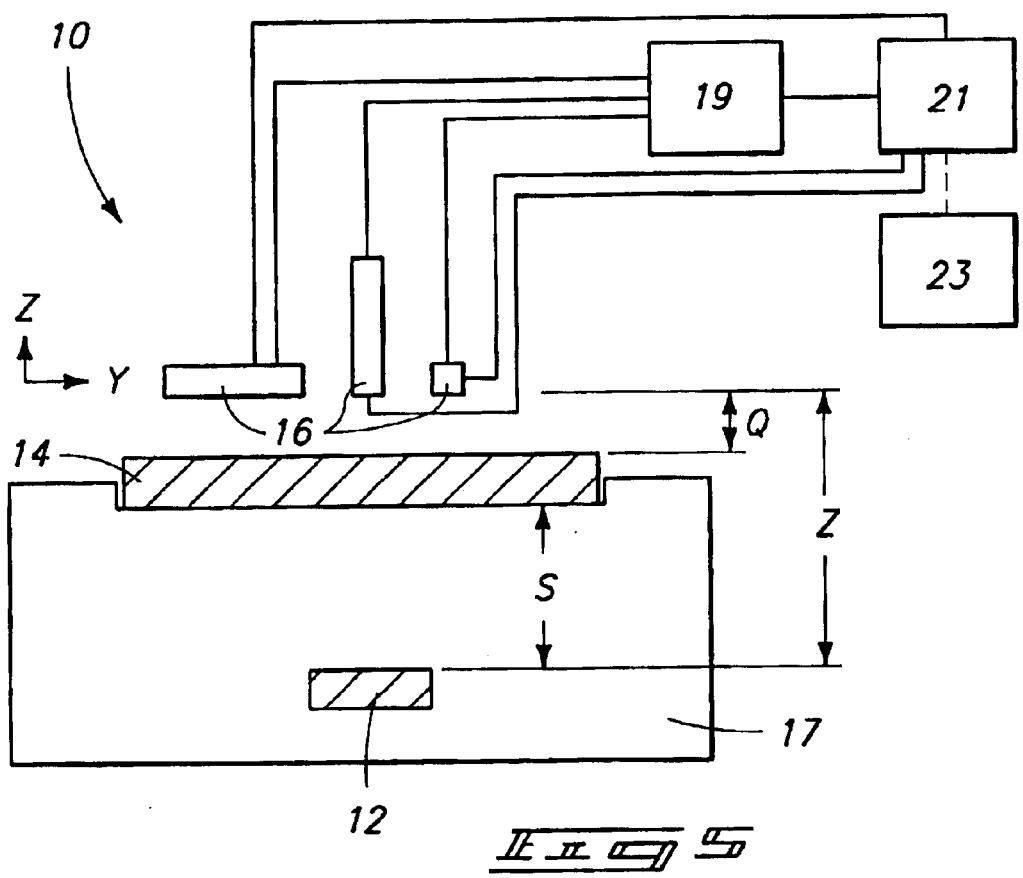
FIG. 5 is a schematic cross-sectional side-view of an apparatus encompassed by the present invention, showing an exemplary magnet location relative to a magnetic material and Hall sensors.

FIG. 5 is a schematic illustration of an apparatus 10 encompassed by the present invention and shows a location of one or more magnets 12 (only one magnet is visible in the view of FIG. 5, but it is to be understood that the shown magnet can be a ring surrounding a second magnet) in relation to a magnetic material 14 which is being tested. Material 14 can be any shape, or any material state (including solid, liquid or gas), and can be in the form of, for example, a sputtering target. Magnet(s) 12 is/are shown retained in a spacer material 17, and separated from magnetic material 14 by a distance "s". An exemplary spacer material 17 is a non-magnetic material, such as, for example, plastic, aluminum or copper. Distance "s" can vary depending on the strength of a magnetic field generated by magnet (s) 12, and in an exemplary embodiment is from about 5 millimeters (mm) to about 50 mm. In the shown embodiment, spacer 17 has a recessed upper surface, with the recess configured to retain magnetic material 14. Although magnet(s) 12 are shown to comprises a smaller horizontal length than material 14, it is to be understood that the relative sizes of material 14 and magnet(s) 12 can be varied depending on, for example, the magnetic field strength and shape generated by magnet(s) 12.

Three magnetic field detectors (also called "probes") 16 are shown spaced from magnet(s) 12 by a region that includes a thickness of material 14. Exemplary magnetic field detectors are Hall sensors, and detectors 16 will be referred to as Hall devices in the discussion that follows. It is to be understood, however, that detectors 16 can comprise magnetic field sensors other than Hall devices.

The three Hall sensors 16 are arranged to measure magnetic field strengths along the three orthogonal axes "x", "y" and "z" (with axis "x" extending into the page). An advantage of detecting along the three orthogonal axes x, y and z, relative to prior art methods which detected only along the axis z, is that more information can be obtained by methodology of the present invention regarding PTF uniformity. It is found that information about PTF along x and y axis directions can be of particular importance in, for example, estimating the performance quality of a sputtering target.

Although three Hall sensors are shown, it is to be understood that the invention encompasses embodiments wherein less than three Hall sensors are utilized, as well as embodiments wherein more than three Hall sensors are utilized. Hall sensors 16 are spaced from an upper surface of magnet (s) 12 by a distance "Z", and are spaced from an upper surface of magnetic material 14 by a distance "Q". The distances "Z" and "Q" can vary depending on the strength of magnet(s) 12. An exemplary distance "Z" is from about 5 mm to about 70 mm, and an exemplary distance "Q" is from about 0.5 mm to about 50 mm. In the shown embodiment, all three of sensors 16 are spaced by the same distances "Z" and "Q", but it is to be understood that the invention encompasses other embodiments (not shown) wherein one or more of the Hall sensors 16 is spaced by different distances "Z" and "Q" relative to one or more others of the Hall sensors 16. Also, it is to be understood that sensors 16 and material 14 can be moved relative to one another, either manually or automatically.

Sensors 16 are connected to a motor 19, which is in turn connected to a processor 21. In the shown embodiment, sensors 16 are also in data communication with processor 21. Motor 19 is configured to move one or more of sensors 16 relative to material 14 so that numerous measurements can be obtained of the magnetic field passing through material 14. Preferably, a field is mapped across an entirety of a surface of material 14, and preferably enough datapoints are sampled by each of sensors 16 so that a spacing between adjacent sampled datapoints is less than 30 mm, and preferably less than 1 mm. Sensors 16 can be moved either vertically or horizontally, but preferably are at least moved horizontally relative to a surface of material 14. It is noted that even though the shown embodiment has sensors 16 connected to motor 19, the invention encompasses other embodiments (not shown) wherein one or both of material 14 and magnet(s) 12 is connected to motor 19 in addition to, or alternatively to, sensors 19. In such embodiments, the material 14 and magnet(s) 12 can be moved in addition to, or alternatively to, sensors 16.

Data obtained with sensors 16 is passed to processor 21. In a preferred embodiment, processor 21 can comprise software configured to correlate the data with a location of sensors 16 relative material 14 at which the data was obtained. Processor 21 can further process the data in order to produce useful, magnetic information, such as PTF. Processor 21 can then form a PTF map describing the flux passing through the material 14. Processor 21 is shown in data communication with an optional output device 23 (such as a computer screen or a printer), which can be utilized to display the PTF map. Data acquired from sensors 16 can also be processed manually, instead of with processor 21 and output device 23.

Figure 6:
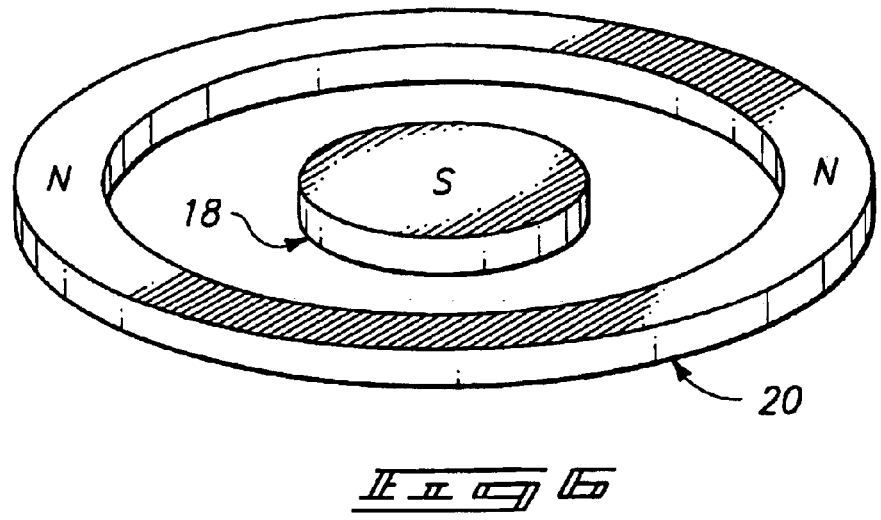
FIG. 6 is a schematic illustration of a ring/solid magnet configuration.
Figure 7:
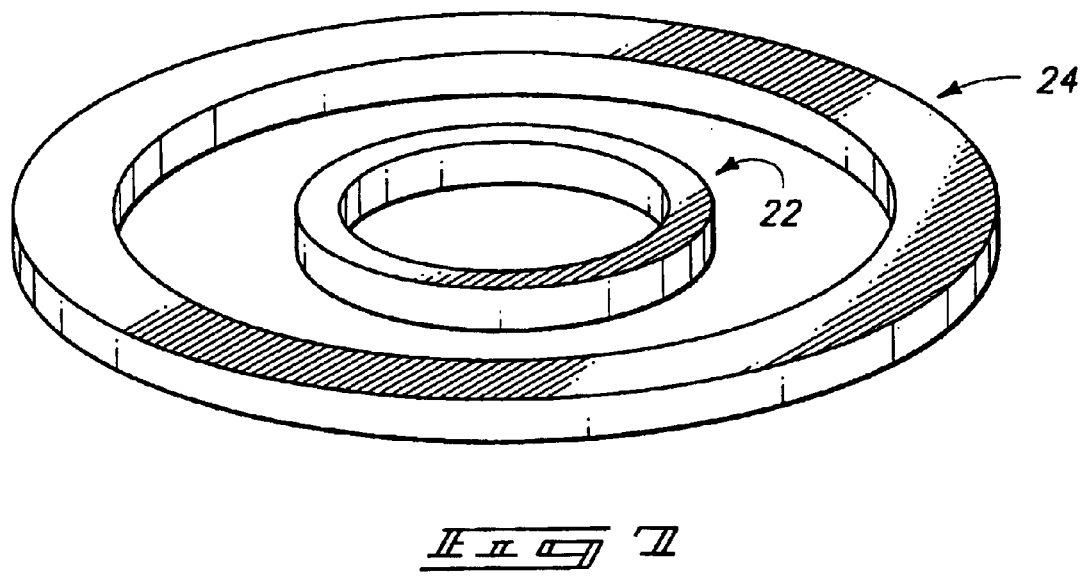
FIG. 7 is a schematic illustration of a ring/ring magnet configuration.
Figure 8:
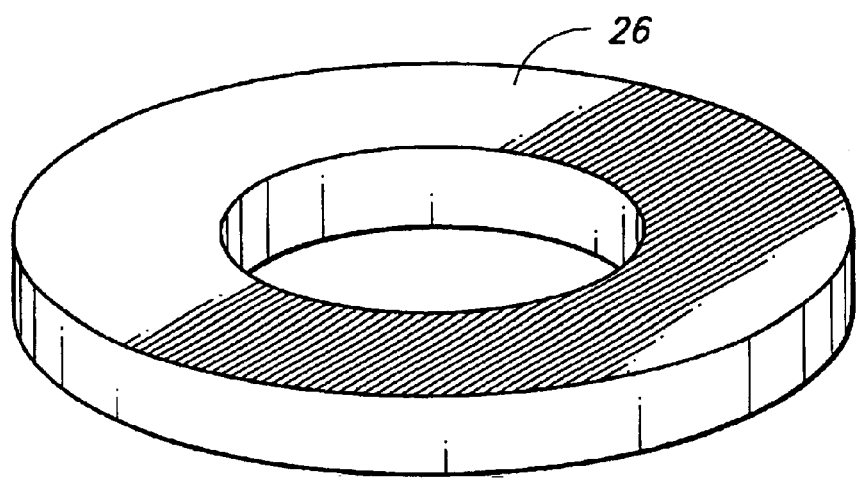
FIG. 8 is a schematic illustration of a one-ring magnet configuration.

The magnet(s) 12 of FIG. 5 can be at least two magnets arranged in such a way that the opposing poles of the magnets are aligned in opposite directions. For example, FIG. 6 illustrates an orientation of a ring/solid configuration of magnets that can be utilized in methodology of the present invention as magnet(s) 12 in FIG. 5. The magnets of FIG. 5 are labeled 18 and 20, with magnet 18 being a solid and magnet 20 being a ring surrounding solid magnet 18. Magnets 18 and 20 are arranged so that the flux flows from the ring 20 to the solid 18 magnet or vice versa. FIG. 7 shows another example orientation of magnets which can be utilized as magnet(s) 12 of FIG. 5. The magnets of FIG. 7 are labeled 22 and 24, and correspond to a first ring magnet 22 surrounded by a second ring magnet 24. FIG. 8 shows yet another example orientation of a magnet which can be utilized as magnet 12 of FIG. 5. The magnet of FIG. 8 is labeled 26, and corresponds to a single ring magnet.

Referring again to FIG. 5, operation of apparatus 10 can comprise placing magnetic material 14 on spacing material 17 and above the magnet(s) 12. The Hall sensor(s) 16, which will have the ability to measure the vector component of the magnetic fields, are then adjusted to the right distance slightly above a surface of material 14. The magnetic field strengths are then measured and recorded. This can be done either automatically or manually. The number of datapoints taken can vary from as little as one to as many as several million. In this way, a desired measurement resolution can be achieved. For percentage PTF calculation, the material 14 is then moved away from the top of the magnet(s) 12 and the magnetic source is measured while maintaining the original arrangement and resolution. The percentage of PTF is calculated by dividing the measurement taken while the material is in place by the measurement taken without the material in place.

EXAMPLE

Figure 9:
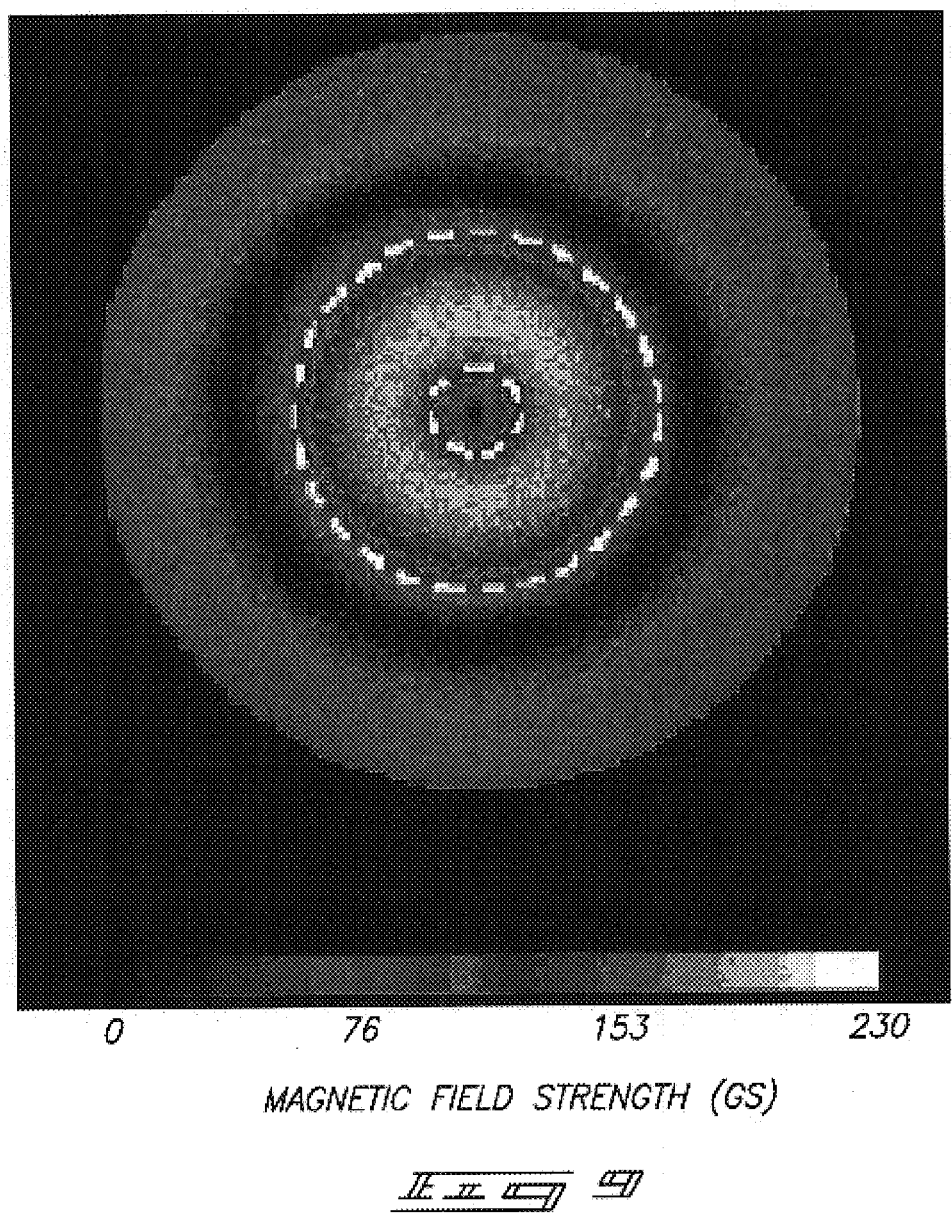
FIG. 9 is a color PTF map showing the magnetic field strength (Gs) for a magnetic material analyzed in accordance with methodology of the present invention.

When using the magnet configuration shown in FIG. 6 in apparatus 10 of FIG. 5, a ring region is defined based on the material and the size of the magnet assembly used (with the term "magnet assembly" referring to the assembly of magnets 18 and 20 of FIG. 6). The area of a magnetic material 14 (such as a sputtering target) is scanned and a flux and PTF map are generated. FIG. 9 shows the flux and PTF maps of a magnetic material based on the ring-solid magnet assembly. The flux and PTF maps from the ring region are interpreted based on five parameters; the maximum-ring, minimum-ring, mean-ring, standard deviation and PTF-percent. When referring to FIG. 9, the maximum flux in the ring region is 123.4 Gs, the minimum flux in the ring region is 0.0 Gs, the average flux in the ring region is 71.6 Gs, and the standard deviation of flux in the ring region is 26/0 Gs. The mean magnetic field strength of the magnet (without the material on top) is also measured and calculated. Thus, a percent PTF is calculated by dividing the mean magnetic field strength by the mean magnetic field strength without the material, and is found to be 80.4%. All of the above-discussed parameters can be calculated in the x, y and z directions. In an exemplary embodiment of this invention, all the calculations are based upon extracted vector components of the x, y and z directions.

Based on the Central Limit Theorem of Statistics, when the number of samples increases, the sample mean will approach the population mean. Because the ASTM method only measures 5 locations on the material, the average of the 5 measurements will have a greater standard deviation (or error) when the average is used to describe the material. The invented method overcomes this problem by having the capability to take any number of measurements up to as many as several million. This greatly improves the reliability of the measurement and the statistical significance of the measurement results. Due to this improvement, the uniformity of the material can be measured and analyzed based on statistical techniques.

PTF uniformity is a very important parameter, particularly when the material is used for the semiconductor or microelectronics industry. PTF uniformity will not only reveal the uniformity of the magnetic field distribution, but also the uniformity of the material itself. The invented method is the first known method that is capable of measuring PTF uniformity with the desired degree of statistical significance. By analyzing this uniformity data, one can further determine the uniformity of the material and other physical and chemical properties of the material, such as composition, stress distribution, temperature, shape, pressure, thickness and texture. The material can be in the form of a solid or liquid. In particular applications of the present invention, understanding and controlling magnetic properties of sputtering targets can allow improved target material utilization and improved deposition rates from targets.

In order to show that the invented method for determining PTF is the preferred method for PTF measurement as compared to the ASTM standard, Gage R&R analyses were performed. In this study, four parameters were compared: PTF (average magnetic flux density that is parallel to the target surface), $S_{PTF}$ (standard deviation of PTF), PTF uniformity, PTF % (PTF/Average flux density without material×100).

Table 1 summarizes the results for each of the above parameters for a method encompassed by the present invention.

TABLE 1

|  | $\sigma_{repeat}$ | $\sigma_{repro}$ | $\sigma_{meas}$ | $\sigma_{total}$ | $\sigma_{meas}/\sigma_{total}$ |
| --- | --- | --- | --- | --- | --- |
| PTF | 0.715 | 0.611 | 0.940 | 60.5 | 0.016 |
| $S_{PTF}$ | 0.74 | 0.301 | 0.799 | 21.4 | 0.037 |

TABLE 1-continued

|  | $\sigma_{repeat}$ | $\sigma_{repro}$ | $\sigma_{meas}$ | $\sigma_{total}$ | $\sigma_{meast}/\sigma_{total}$ |
|---|---|---|---|---|---|
| Uniformity | 1.48 | 0.495 | 1.56 | 15.3 | 0.102 |
| PTF % | 0.406 | 0.195 | 0.451 | 24.4 | 0.018 |

Table 2 summarizes the results for the each of the above parameters for the ASTM method.

TABLE 2

|  | $\sigma_{repeat}$ | $\sigma_{repro}$ | $\sigma_{meas}$ | $\sigma_{total}$ | $\sigma_{meast}/\sigma_{total}$ |
|---|---|---|---|---|---|
| PTF | 2.063 | 0.428 | 2.107 | 89.4 | 0.024 |
| $S_{PTF}$ | 0.762 | 0.136 | 0.774 | 2.055 | 0.377 |
| Uniformity | 3.097 | 0.442 | 3.129 | 6.754 | 0.463 |
| PTF % | 0.509 | 0.106 | 0.520 | 28.46 | 0.018 |

The results of the Gage R&R show that the method encompassed by the present invention has a much better repeatability and reproducibility as compared to the ASTM method.

What is claimed is:

1. An apparatus for determining the pass through flux of a magnetic material comprising:
    at least one magnetic source including at least one ring-shaped electromagnet generating a magnetic field passing through the magnetic material;
    one or more magnetic field detectors configured to measure one or more of x and y components of the magnetic field; and
    a mechanism configured to move one or more of the magnetic source, magnetic field detectors, and magnetic material.

2. The apparatus of claim 1 further comprising a device configured to generate a pass through flux value using measurements from the one or more magnetic field detectors.

3. The apparatus of claim 1 further comprising a processor in data communication with the magnetic field detectors and configured to generate a map of pass through flux of the magnetic material.

4. The apparatus of claim 1 wherein the magnetic material comprises a sputtering target.

5. The apparatus of claim 1 wherein the at least one magnetic source is beneath the magnetic material.

6. The apparatus of claim 1 wherein the at least one magnetic source comprises at least two magnetic sources.

7. The apparatus of claim 1 wherein the at least one ring-shaped magnet comprises a single ring-shaped magnet and surrounds a solid magnet.

8. The apparatus of claim 1 wherein the at least one ring-shaped magnet comprises a first ring-shaped magnet within a second ring-shaped magnet.

9. The apparatus of claim 1 wherein the magnetic source comprises only one ring-shaped magnet.

10. The apparatus of claim 1 wherein the one or more magnetic field detectors comprise two or more magnetic field detectors configured to measure two or more of x, y, and z components of the magnetic field.

11. An apparatus for determining the pass through flux of a magnetic material comprising:
    at least one magnetic source beneath the magnetic material, the magnetic source generating a magnetic field;
    one or more magnetic field detectors configured to measure at least a x component of the magnetic field;
    a mechanism configured to move one or more of said magnetic source, magnetic field detectors and magnetic material; and
    a processor in data communication with the magnetic field detectors and configured to generate a map of pass through flux of the magnetic material.

12. An apparatus for determining the pass through flux of a magnetic material comprising:
    at least one magnetic source beneath the magnetic material, the magnetic source generating a magnetic field;
    one or more magnetic field detectors configured to measure at least a y component of the magnetic field;
    a mechanism configured to move one or more of said magnetic source, magnetic field detectors and magnetic material; and
    a processor in data communication with the magnetic field detectors and configured to generate a map of pass through flux of the magnetic material.

13. A method for determining the pass through flux of a magnetic material comprising:
    generating a magnetic field on one side of the magnetic material and passing the magnetic field through the magnetic material and out an other side of the magnetic material;
    collecting magnetic field vector information at the other side of the magnetic material with two or more detectors configured to measure two or mere of the x, y, and z components of the magnetic field; and
    moving one or more of the magnetic field, the at least one of the two or more detectors, and the magnetic material during the collecting.

14. The method of claim 13 wherein the one side of the magnetic material comprises a bottom side and the other side of the magnetic material comprises a top side.

15. The method of claim 13 comprising collecting magnetic field vector information with three detectors configured to measure one or more of the x, y, and z components of the magnetic field.

16. The method of claim 13 wherein the magnetic field is generated by a magnet.

17. The method of claim 13 wherein the magnetic field is generated by two or more magnetic sources.

* * * * *